(12) United States Patent
Lin

(10) Patent No.: US 7,830,193 B2
(45) Date of Patent: Nov. 9, 2010

(54) TIME-DELAY BUFFER

(75) Inventor: Hung-Sung Lin, Miaoli County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 22 days.

(21) Appl. No.: 12/276,418

(22) Filed: Nov. 24, 2008

(65) Prior Publication Data

US 2010/0127748 A1 May 27, 2010

(51) Int. Cl.
*H03H 11/26* (2006.01)
(52) U.S. Cl. .................. 327/283; 327/276; 327/277; 327/284

(58) Field of Classification Search .................. 327/283
See application file for complete search history.

(56) References Cited

U.S. PATENT DOCUMENTS

2002/0021159 A1* 2/2002 Takahashi .................. 327/283

* cited by examiner

*Primary Examiner*—Lincoln Donovan
*Assistant Examiner*—John W Poos
(74) *Attorney, Agent, or Firm*—Winston Hsu; Scott Margo

(57) ABSTRACT

A time-delay buffer having a CMOS inverter and a capacitor is disclosed. The CMOS inverter of the time-delay buffer has a silicide layer partially disposed on the transistor gate of the CMOS and a non-silicide region lain in between the silicide layers. Therefore, the time-delay buffer of the present invention has a resistance therein, and results in a period of time delayed in the circuit.

20 Claims, 9 Drawing Sheets

TIME-DELAY BUFFER

BACKGROUND OF THE INVENTION

1. Field of the Invention

The present invention is related to a time-delay buffer, and particularly, to a time-delay buffer having a silicide layer partially formed on the transistor gate thereof.

2. Description of the Prior Art

By their nature, logic circuit designs are timing dependent. Therein, most signals within a logic design must be synchronized with each other. However, there are instances where signals intended to be synchronized are not. For example, between two logic signals, one may be processed through a logic circuit faster than the other, and thereby the signals become non-synchronized. When this occurs, the faster of the two signals is typically time delayed so as to synchronize it with the other signal. One synchronization mechanism for implementing a time delay is known as a time delay buffer.

On a fundamental level, a timing delay buffer can be thought of as adding a predetermined amount of time delay to a circuit. In practice, a time delay buffer is generally inserted into a signal path so as to intercept a signal, add a predetermined amount of time delay to the signal, and then retransmit the time delayed signal onto the signal line. This accomplished, a faster logic signal can be time synchronized with a slower logic signal.

Conventional time delay device is formed from a chain of inverters with their inputs and outputs connected in series. FIG. 1 illustrates an example of such a timing delay device. A plurality of inverters 10 are connected in series, such that an input signal at the input terminal 12 will appear as a time delayed signal at the output 14. In this configuration of a timing delay buffer, the sum total of each inverter's delay time determines the total delay time of the series of inverters. In addition, time delay is determined by means of adjusting the width and the length of the inverters.

However, a problem occurs when the pluralities of inverters 10 connected in series are formed below the 100 nm process. That is, a number of the inverters 10 connected in series occupy a lot of space that limits the size of the time delay device. Besides, adjusting the width or the length of the channel changes the sub-threshold of the time delay device, especially the time delay device formed below the 100 nm process.

SUMMARY OF THE INVENTION

The present invention provides a time-delay circuit, which has an input terminal, an output terminal, and at least a time-delay buffer coupled between the input terminal and the output terminal. The time-delay buffer has a CMOS inverter having a PMOS transistor, an NMOS transistor, and a silicide layer partially disposed on a transistor gate common to the PMOS transistor and the NMOS transistor. The time-delay buffer further has a capacitor coupled to an output terminal of the CMOS inverter.

In addition, the present invention further provides a time-delay buffer. The time delay buffer has a CMOS inverter, a transistor gate common to a PMOS transistor and a NMOS transistor of the CMOS inverter, and a inverter further has a silicide layer disposed on a source/drain of the PMOS transistor and a source/drain of the NMOS transistor. In addition, the silicide layer is partially disposed on portion of the transistor gate that may increases the parasite resistance of the CMOS inverter.

Since the silicide layer is partially disposed on the transistor gate of the CMOS inverter that results in a higher parasite resistance of the CMOS inverter, one time-delay buffer of the present invention is enough for determining the delay time.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

The present invention is a time-delay circuit of useful for CMOS logic circuits. The invention uses a CMOS inverter having a non-silicide region to delay a period of time for a family of CMOS logic circuits which include AND, NAND, OR, NOR, XOR, XNOR, select, select-invert, invert, and not-invert functions. Each circuit is tuned to provide substantially equal delays, high-quality logic ones and zeros, and substantially equal rise and fall times for every combination of input-state transition and output-state transition.

Figure 1:
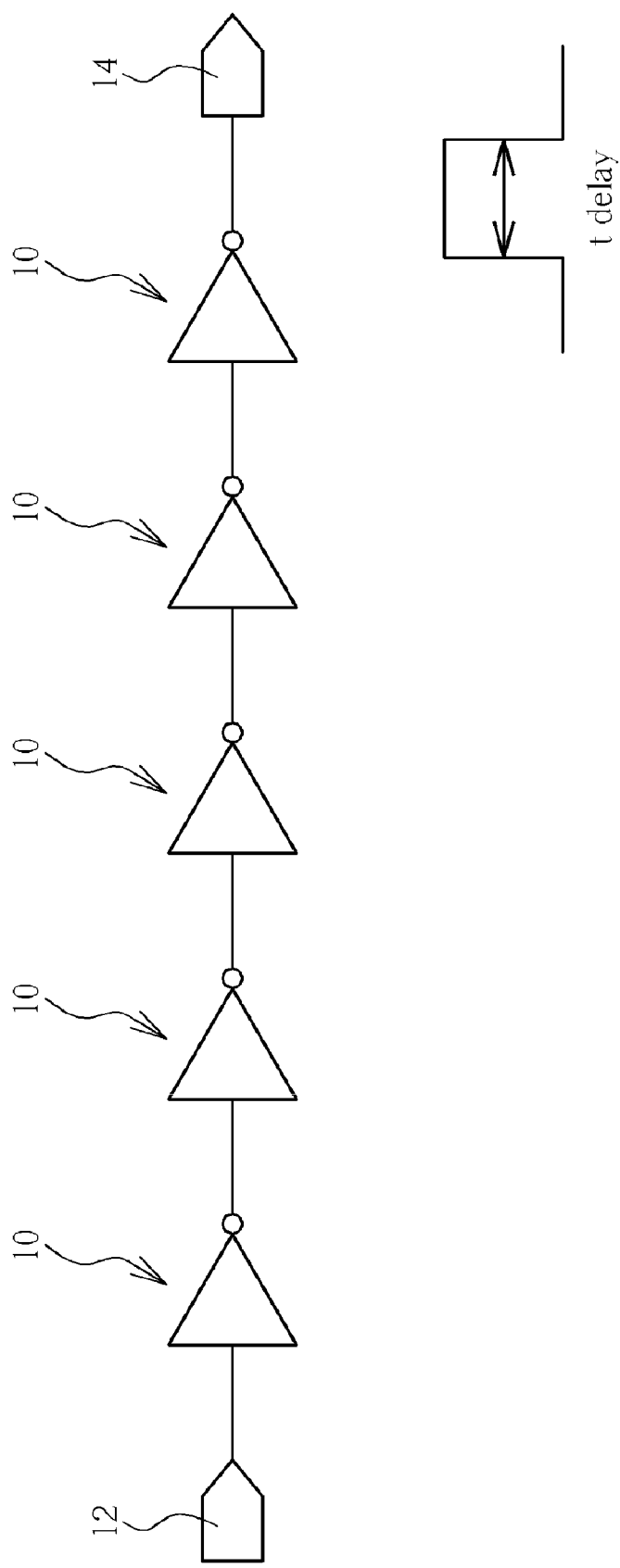
FIG. 1 illustrates a conventional timing delay device.
Figure 2:
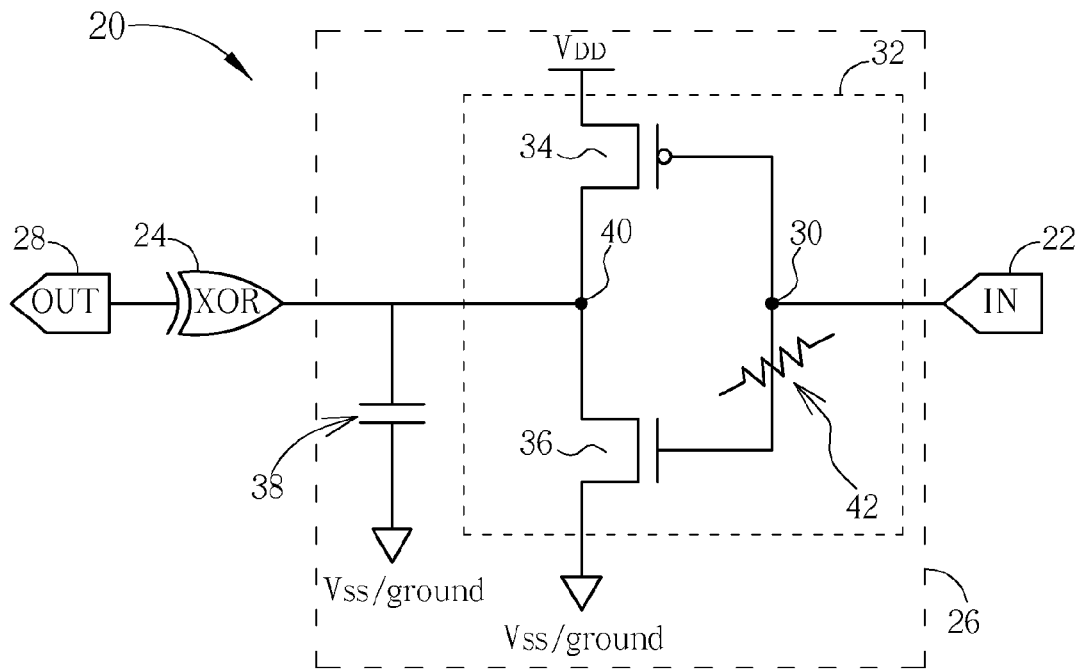
FIG. 2 and FIG. 3 are schematic diagrams of a time-delay circuit according to a first preferred embodiment of the present invention.

Please refer to FIG. 2, which is a schematic diagram of a time-delay circuit 20 according to a first preferred embodiment of the present invention. The time-delay circuit 20 includes an input terminal 22, a CMOS logic circuit 24, a time-delay buffer 26, and an out put terminal 28. The CMOS logic circuit 24 is electrically connected between the output terminal 28 and an output terminal of the time-delay buffer 26. The time-delay buffer 26 includes a CMOS inverter 32, which has a PMOS transistor 34, an NMOS transistor 36, and a capacitor 38 coupled to an output terminal 40 of the CMOS inverter 32. The CMOS inverter 32 is electrically connected between a first voltage $V_{DD}$ of higher voltage and a second voltage $V_{ss}$ of lower voltage or ground. The PMOS transistor 34 has its source connected to the $V_{DD}$ and its drain connected to the drain of the NMOS transistor 36. The source of the NMOS transistor 36 is electrically connected to the $V_{ss}$. As shown in FIG. 2, a first resistor 42 is connected between the input terminal 30 of the time-delay buffer 26 and the gate of the NMOS transistor 36. For better understanding, the structure of the CMOS inverter 32 is illustrated in FIG. 3.

Figure 3:
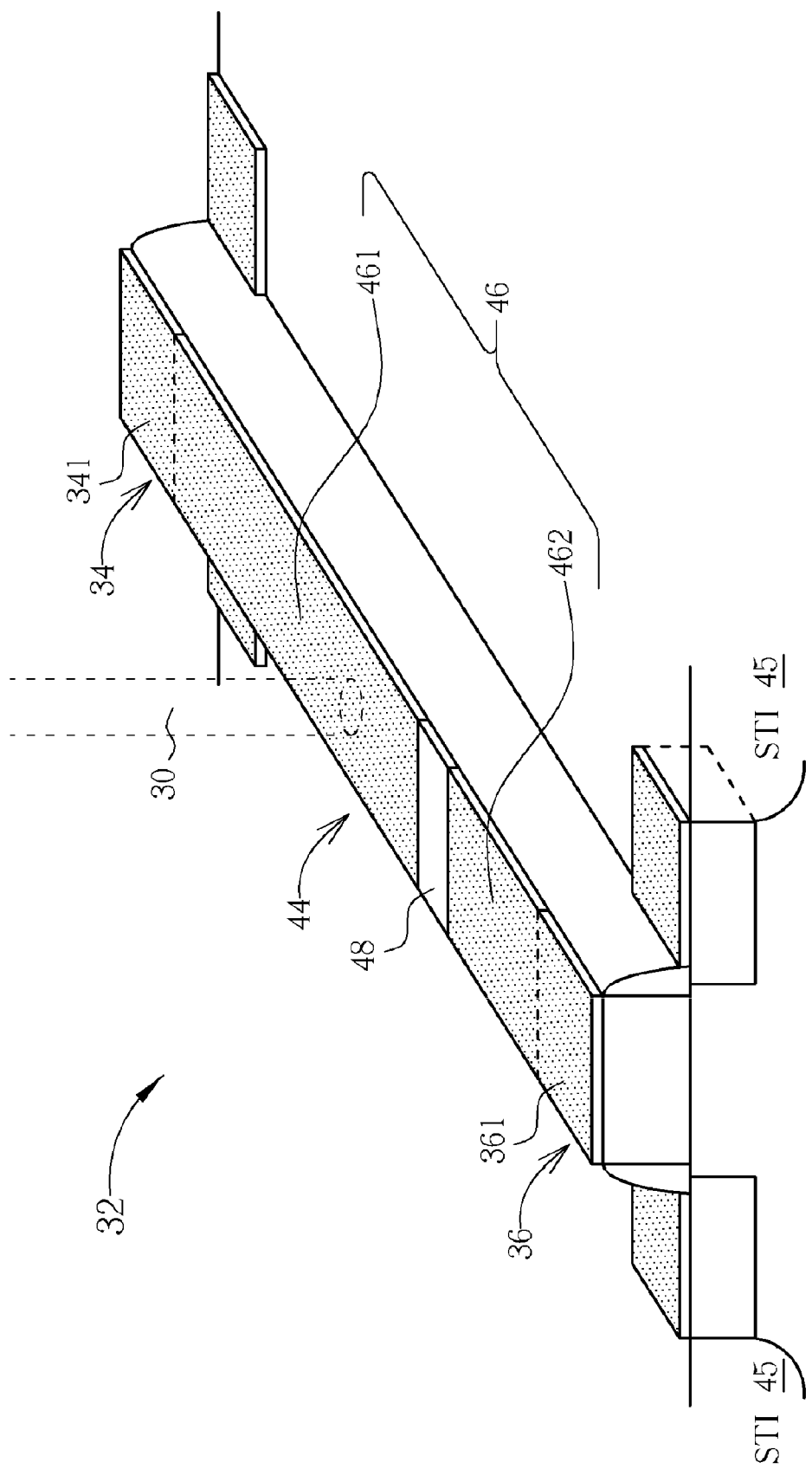

As shown in FIG. 3, the CMOS inverter 32 is formed on a substrate (not shown), such as a silicon substrate, and the active areas of the PMOS transistor 34 or the NMOS transistor 36 are isolated by a plurality of isolation structures, such as shallow trench isolations (STI) 45. A polysilicon line is formed on the substrate, and the gate 341 of the PMOS transistor 34 and the gate 361 of the NMOS transistor 36 are defined on the polysilicon line. Since the gate 341 of the PMOS transistor 34 and the gate 361 of the NMOS transistor 36 are connected through the polysilicon line, the polysilicon line between the gate 341 of the PMOS transistor 34 and the gate 361 of the NMOS transistor 36 may be regarded as a transistor gate 44 common to the PMOS transistor 34 and the NMOS transistor 36. Furthermore, a silicide layer 46 is disposed on the source/drain of the PMOS transistor 34, the source/drain of the NMOS transistor 36, a portion of the polysilicon line (the transistor gate 44) between the PMOS transistor 34 and the NMOS transistor 36. The silicide layer formed on the polysilicon line is separated by a first non-silicide region 48, and consequently the separated silicide layers are defined as a first silicide layer 461, which is positioned between the first non-silicide region 48 and the PMOS transistor 34, and a second silicide layer 462, which is positioned between the first non-silicide region 48 and the NMOS transistor 36. That is, the silicide layer 46 is partially formed on the transistor gate 44 between the PMOS transistor 34 and the NMOS transistor 36. In the present embodiment, the first non-silicide region 48 may be a silicide block, shown in the present embodiment, formed before the self-align silicide process. The silicide block of the present invention may be formed by a deposition process, a lithography process, and an etch process to define the silicide block on the polysilicon line (the transistor gate 44) between the PMOS transistor 34 and the NMOS transistor 36. Additionally, the first non-silicide region 48 may be formed from the materials of a resistance between the silicide layer 46 and the polysilicon line. Since the first non-silicide region 48 is a silicide block, the current flowing through the polysilicon line (the transistor gate 44) may pass through the first non-silicide region 48 via the polysilicon line disposed under the first non-silicide region 48. If the first non-silicide region 48 comprises the material having a resistance between the silicide layer 46 and the polysilicon line, it increases the total resistance of the CMOS inverter 32. Thus the first non-silicide region 48 may be regarded as the first resistor 42 shown in FIG. 2 that increases the resistance of the CMOS inverter 32. That is, the silicide layer 46 is partially formed on the transistor gate 44 between the PMOS transistor 34 and the NMOS transistor 36. As shown in FIG. 3 the transistor gate 44 is connected to the CMOS logic circuit 24 via a contact, which acts as the input terminal 30 of the time delay buffer 26.

A formula indicating the relation between the resistance of the time-delay buffer and the delay time resulting from the time-delay buffer is shown as follows:

$$Tp \propto \frac{C_L V_{DD}}{I_D} = \frac{C_L V_{DD}}{\beta\left[(V_{GS} - V_m) - \frac{1}{2}mV_{DS}\right]V_{DS}}$$

wherein the symbols represent:
$T_p$: the delay time resulting from the time-delay buffer;
$C_L$: capacitance of the BL wire;
$V_{DD}$: the second voltage;
$I_D$: the current of the time-delay circuit;
$V_{GS}$: gate to source voltage;
$V_m$: threshold voltage; and
$V_{DS}$: drain to source voltage.

The first non-silicide region 48 and the partially disposed silicide layer 46 increase the parasite resistance of the CMOS inverter 32. The current of the time-delay circuit shown in FIG. 2 is consequently reduced, and charging capacitor 38 needs a longer time. Accordingly, the time-delay effect is resulting from the time-delay buffer 26 of the present invention.

Figure 4:
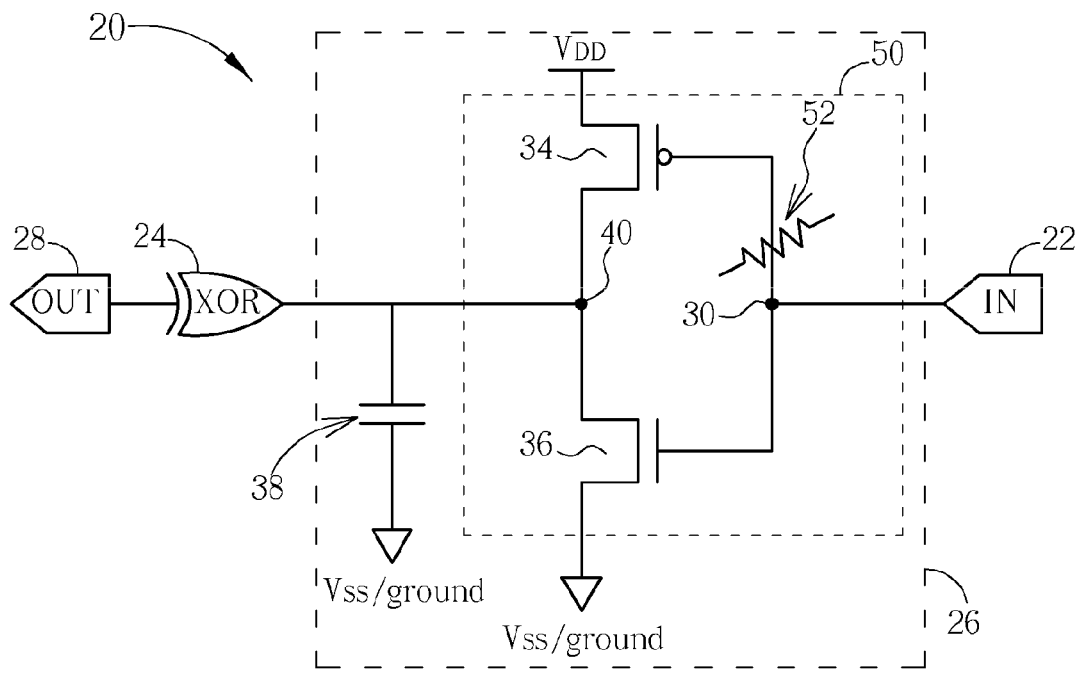
FIG. 4 and FIG. 5 are schematic diagrams of a time-delay circuit according to a second preferred embodiment of the present invention.
Figure 5:
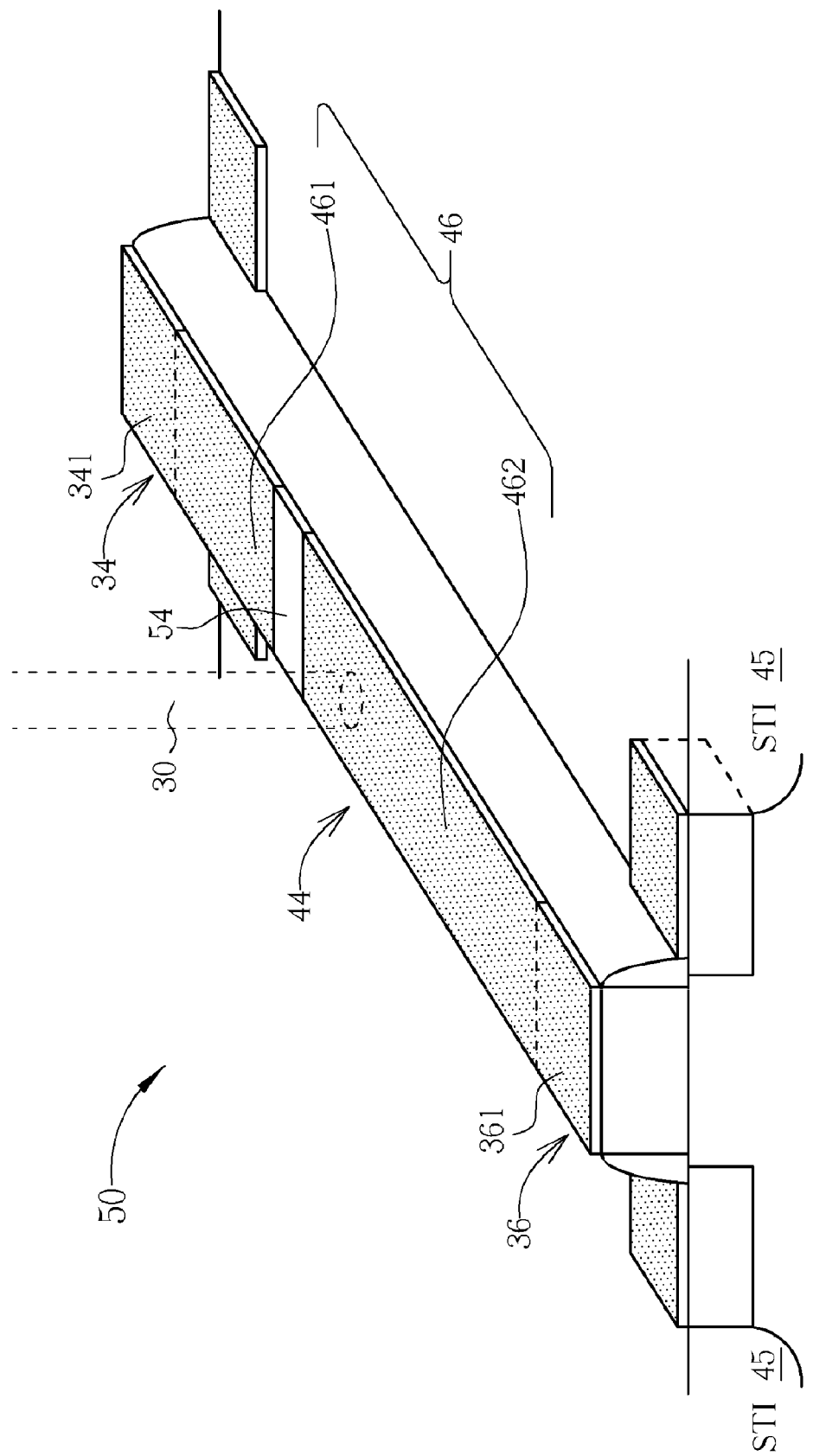

The non-silicide region may be disposed on any places along the polysilicon line. Referring to FIG. 4 and FIG. 5, time-delay circuit in accordance with a second embodiment of the invention, comprises a CMOS inverter 50, similar to the circuit of FIG. 2, coupling to a capacitor 38. In order to more easily distinguish the difference between the second embodiment and the first embodiment, the same elements of FIG. 4 and FIG. 5 use the same notation as the first embodiment. As shown in FIG. 4, a second resistor 52 is electrically connected between the input terminal 30 of the time-delay buffer 26 and the gate of the PMOS transistor 34. Similar to the first embodiment, a second non-silicide region 54 forces the current passing through the second non-silicide region 54 via the polysilicon line disposed under the second non-silicide region 54, in which the polysilicon line has a resistance larger than the silicide layer 46. In the present embodiment, the second non-silicide region 54 may be regarded as the second resistor 52 shown in FIG. 4. The second non-silicide region 54 is positioned between the input terminal 30 and the gate 341 of the PMOS transistor 34, and accordingly, the position of the second non-silicide region 54 is disposed closer to the gate 341 of the PMOS transistor 34 than to the gate 361 of the NMOS transistor 36.

Figure 6:
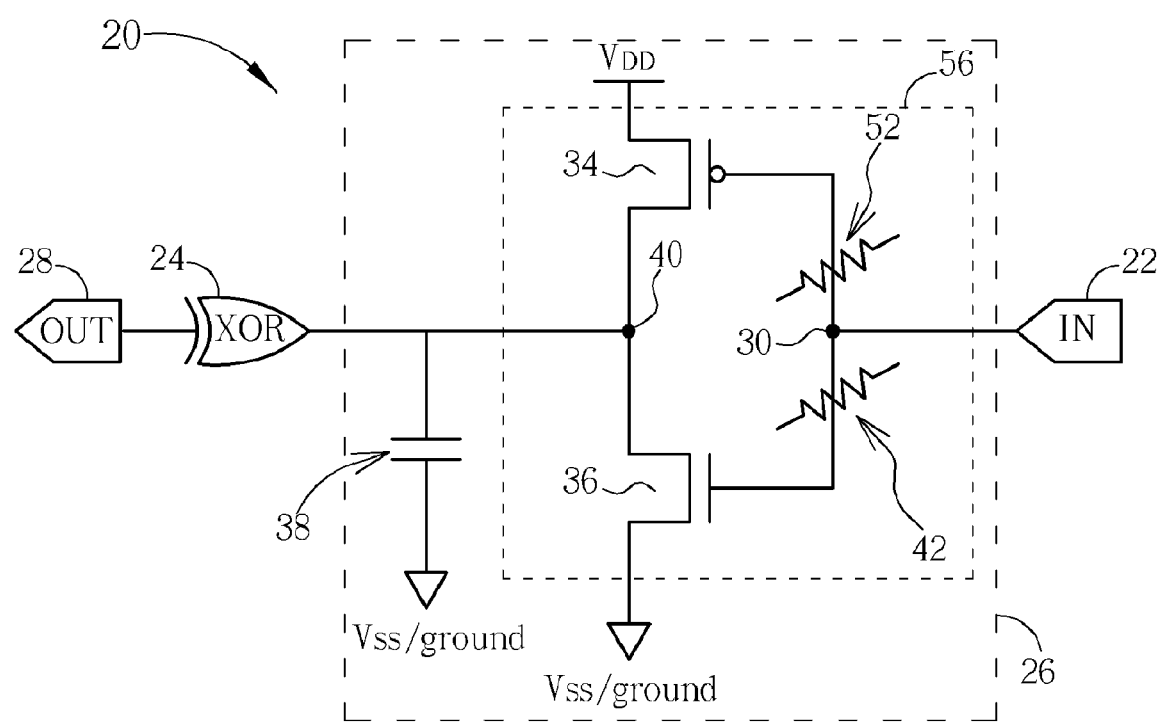
FIG. 6 and FIG. 7 are schematic diagrams of a time-delay circuit according to a third preferred embodiment of the present invention.
Figure 7:
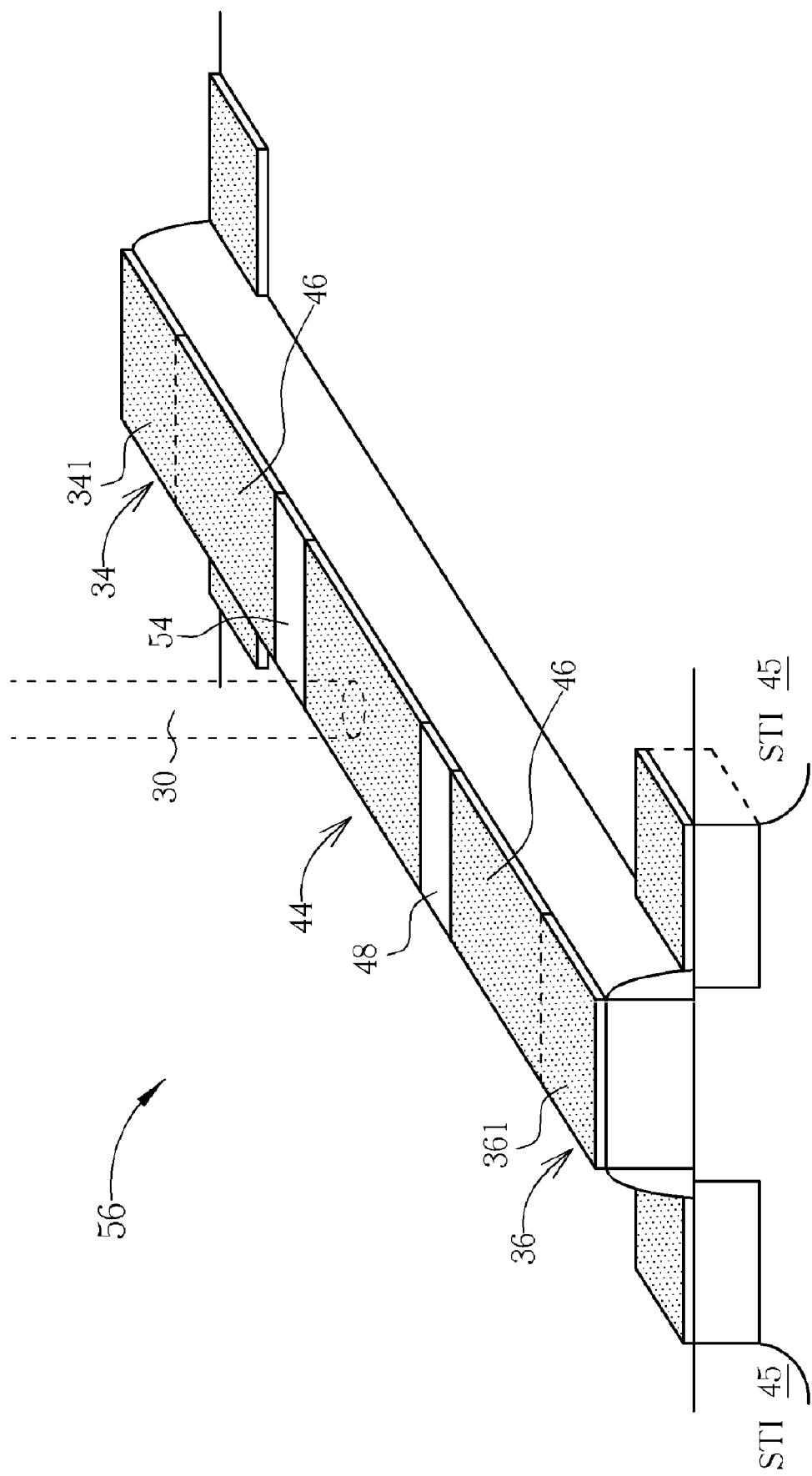

Furthermore, the time-delay buffer of the present invention may have more than one non-silicide region between the PMOS transistor 34 and the NMOS transistor 36. Please refer to FIG. 6 and FIG. 7. FIG. 6 and FIG. 7 are schematic diagrams of a time-delay circuit according to a third preferred embodiment of the present invention. In order to more easily distinguish the difference among the first embodiment, the second embodiment, and the third embodiment, the same elements of FIG. 6 and FIG. 7 use the same notation as the first embodiment and the second embodiment. As shown in FIG. 7, a CMOS inverter 56 is coupled to the capacitor 38, and has a plurality of non-silicide regions lain in between the silicide layers 46. Two non-silicide regions, the first non-silicide region 48 and the second non-silicide region 54, are respectively disposed on the polysilicon line (the transistor gate 44). The first non-silicide region 48 is respectively disposed between the input terminal 30 and the NMOS transistor 36, and acts as the first resistor 42 shown in FIG. 6. The second non-silicide region 54 is respectively disposed between the input terminal 30 and the PMOS transistor 34, and acts as the second resistor 52 shown in FIG. 6.

Figure 8:
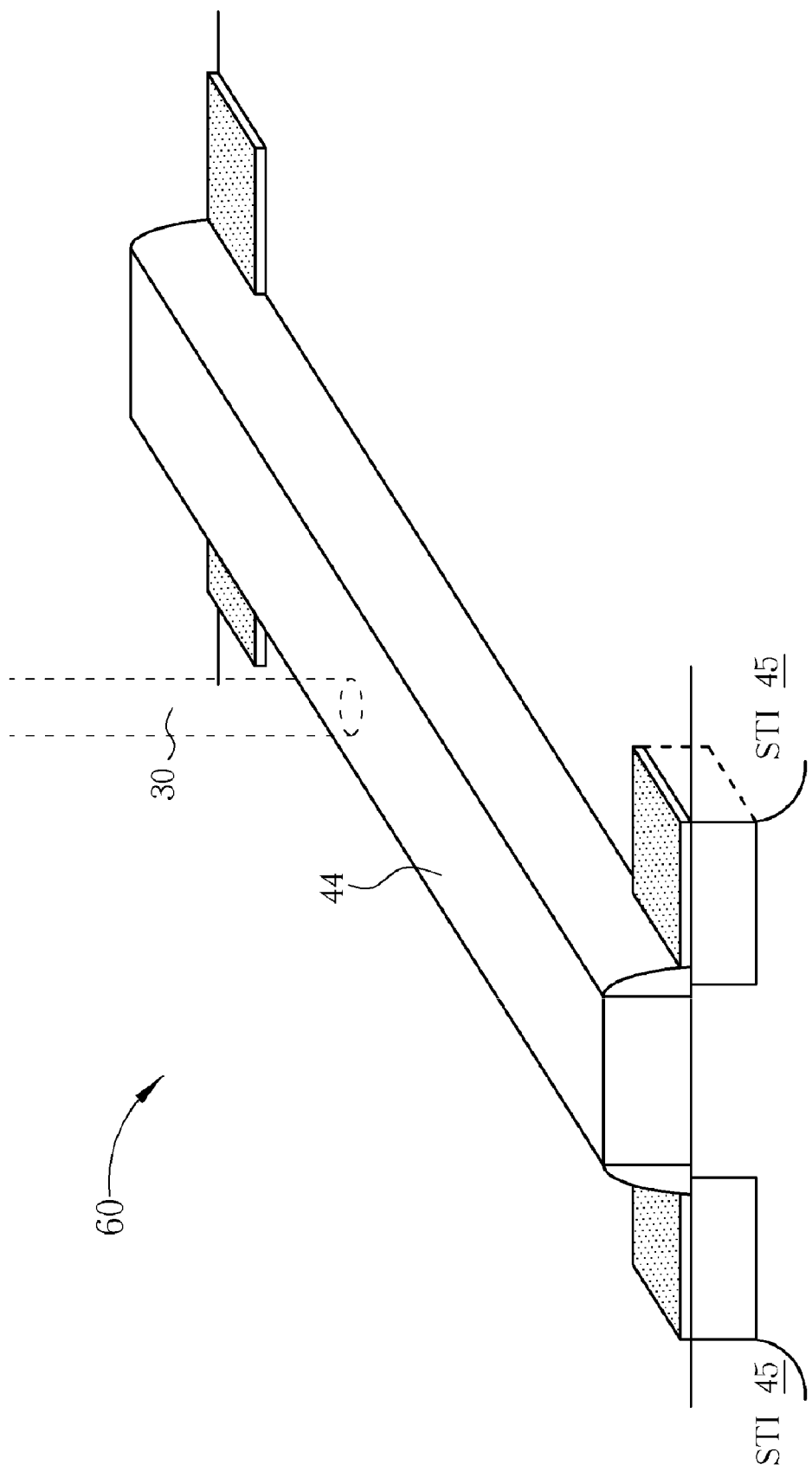
FIG. 8 is schematic diagram of a time-delay circuit according to a fourth preferred embodiment of the present invention.

FIG. 8 is a schematic diagram showing a CMOS inverter 60 of a time-delay buffer according to a fourth embodiment of the present invention. In order to more easily distinguish the difference between the fourth embodiment and the above-mentioned embodiments, the same elements of FIG. 8 use the same notation as the above-mentioned embodiments. As shown in FIG. 8, the CMOS inverter 60 has a silicide layer 46 disposed on the source/drain of the PMOS transistor 34 and the source/drain of the NMOS transistor 36. It should be noted that no silicide layer 46 is formed on the polysilicon line (the transistor gate 44) between the PMOS transistor 34 and the NMOS transistor 36. In addition, the polysilicon line (the transistor gate 44) between the PMOS transistor 34 and the NMOS transistor 36 may be covered by a silicide block as the non-silicide regions shown in the above-mentioned embodiments. Therefore, the CMOS inverter 60 may have a higher resistance than above-mentioned CMOS inverters of the present invention for a longer period of the time delay.

Figure 9:
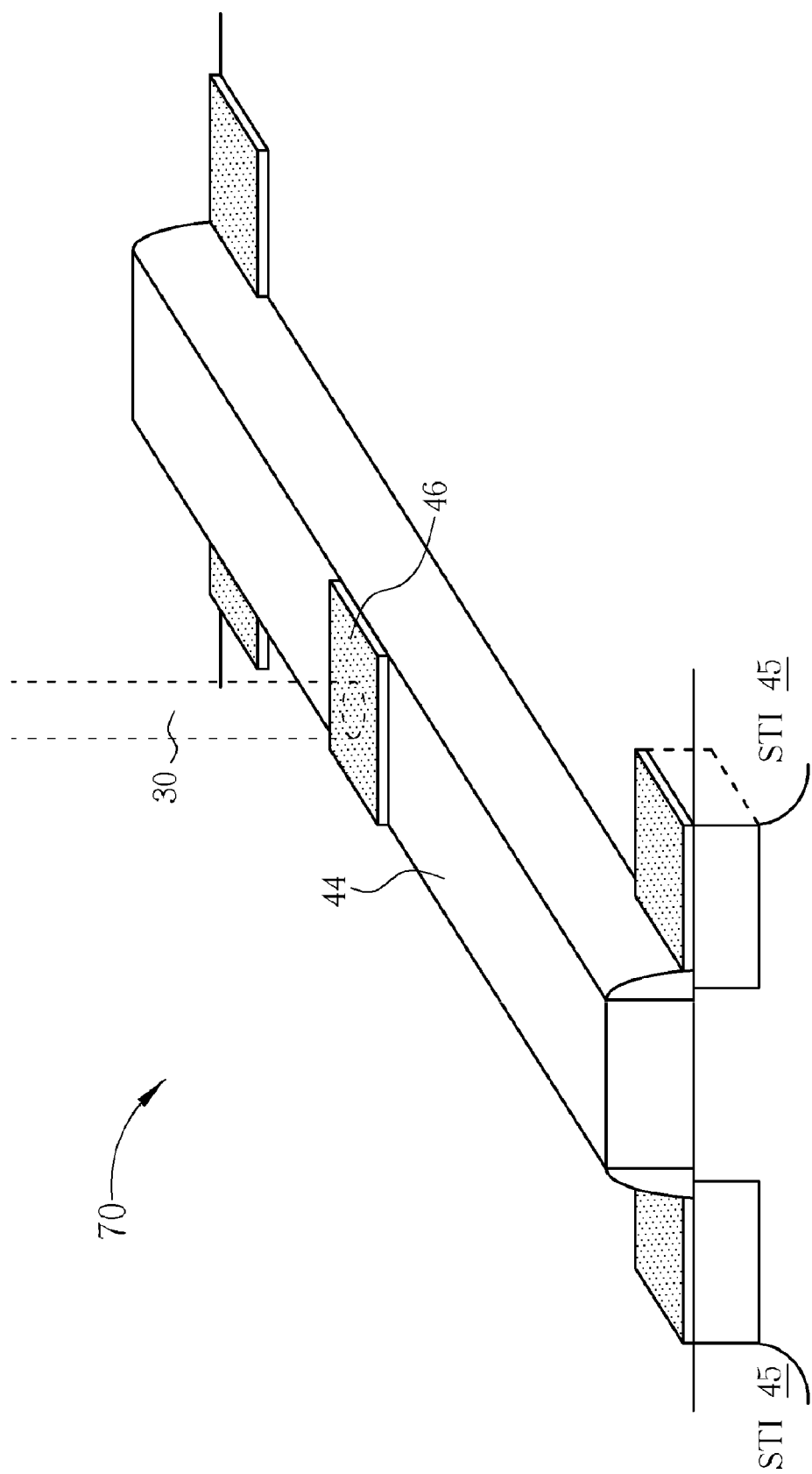
FIG. 9 is schematic diagram of a time-delay circuit according to a fifth preferred embodiment of the present invention.

Furthermore, a CMOS inverter 70 of a time-delay buffer according to a fifth embodiment of the present invention is disclosed. Please refer to FIG. 9. For easily distinguishing the difference between the present embodiment and the above-mentioned embodiments, the same elements of FIG. 9 use the same notation as the above-mentioned embodiments. As shown in FIG. 9, the CMOS inverter 70 has a silicide layer 46 disposed on the polysilicon line (the transistor gate 44), source/drain of the PMOS transistor 34, and the source/drain of the NMOS transistor 36. It should be noted that the silicide layer 46 is sandwiched between the polysilicon line (the transistor gate 44) and the contact, which acts as the input terminal 30, in the area where the contact connects to the polysilicon line (the transistor gate 44). Moreover, the CMOS inverter 60 and the CMOS inverter 70 may replace the CMOS inverter 32, the CMOS inverter 50, or the CMOS inverter 56 in the above-mentioned embodiments. That is, the CMOS inverter 60 and the CMOS inverter 70 may be coupled between the input terminal and the capacitor, in which the CMOS inverter 60 and the CMOS inverter 70 have similar function as the CMOS inverter 32, the CMOS inverter, or the CMOS inverter 56 in the above-mentioned embodiments.

Figure 10:
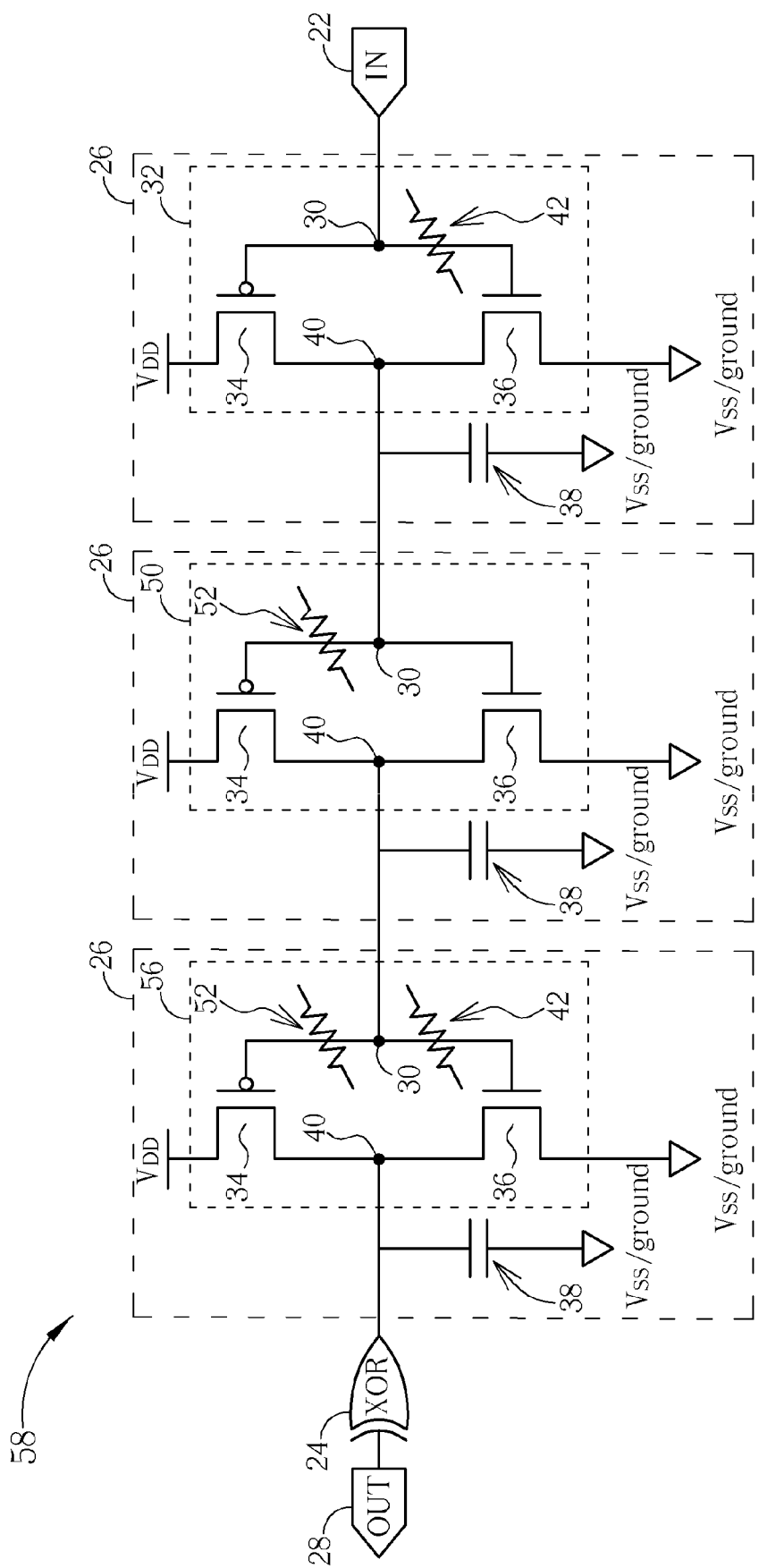
FIG. 10 is schematic diagram of a time-delay circuit according to a sixth preferred embodiment of the present invention.

In addition, if the delay time resulting from a time-delay buffer of the present invention is not long enough, a plurality of the time-delay buffers of the present invention may be connected in series. Please refer to FIG. 10, which is a schematic diagram showing a time-delay circuit 58 according to a sixth embodiment of the present invention. As shown in FIG. 10, the time-delay circuit 58 includes an input terminal 22, a CMOS logic circuit 24, a plurality of time-delay buffers, and an output terminal 28. The CMOS logic circuit 24 is electrically connected between the input terminal 22 and an input terminal 30 of the time-delay buffers. Each time-delay buffer 26 includes a respective CMOS inverter 32, 50, 56, and a capacitor coupled to an output terminal 40 of respective CMOS inverter 32, 50, 56. Similar to the above-mentioned embodiments, the CMOS inverter 32, shown in FIG. 10, has a PMOS transistor 34, a NMOS transistor 36, and a first resistor 42 connected between the input terminal 30 of the CMOS inverter and the gate of the NMOS transistor 36. The CMOS inverter 50, shown in FIG. 10, has a second resistor 52 connected between the input terminal 30 of the CMOS inverter 50 and the gate of the PMOS transistor 34. The CMOS inverter 56, shown in FIG. 10, has the first resistor 42 connected between the input terminal 30 of the CMOS inverter 56 and the gate of the NMOS transistor 36 and the second resistor 52 respectively connected between the input terminal 30 of the CMOS inverter 56 and the gate of the PMOS transistor 34. Therefore, the sum total of the time-delay buffers 26 determines the total delay time of the series of the time-delay buffers 26. The time-delay buffers connected in series may have other sequence of the CMOS inverters. The CMOS inverter 50 having the second resistor 52 may be connected at the first place and other CMOS inverters are connected in the following. The number of the time-delay buffers connected in series is not limited to the third embodiment. It may be modified depending on the total delay time of the time-delay circuit.

Since the time-delay buffer of the present invention has a non-silicide region disposed on the polysilicon line (the transistor gate), and therefore, the silicide layer is disposed partially on the polysilicon line (the transistor gate) of the CMOS. The non-silicide region results in a higher parasite resistance of the CMOS inverter. As a result, one time-delay buffer of the present invention may be enough for determining the period of the time delay for the circuit. The size (width and length) of the non-silicide region may be adjusted for determining the period of the time delay by the time-delay buffer of the present invention. The non-silicide region may be formed not only on the polysilicon line between the NMOS transistor and the PMOS transistor, but also may be formed on the gate of the PMOS transistor or the NMOS transistor. The time-delay circuit having the time-delay buffer of the present invention uses less space for the time-delay buffer, and therefore, more devices may be formed in the same chip or the same wafer. Furthermore, the time-delay buffer of the present invention may also be connected in series to increase the total delay time of the circuit, if it is required.

Those skilled in the art will readily observe that numerous modifications and alterations of the device and method may be made while retaining the teachings of the invention.

What is claimed is:

1. A time-delay circuit, comprising:
   an input terminal and an output terminal; and
   at least a time-delay buffer coupled between the input terminal and the output terminal, the time-delay buffer comprising:
     a CMOS inverter having a PMOS transistor, an NMOS transistor, and a silicide layer partially disposed on a transistor gate common to the PMOS transistor and the NMOS transistor;
     a first non-silicide region disposed on the transistor gate; and
     a capacitor coupled to an output terminal of the CMOS inverter.

2. The time-delay circuit of claim 1, further comprising a CMOS logic circuit coupling to an out terminal of the capacitor and the output terminal.

3. The time-delay buffer of claim 1, wherein the first non-silicide region is positioned closed to the NMOS transistor.

4. The time-delay buffer of claim 3, wherein the CMOS inverter further comprises a second non-silicide region disposed on the transistor gate, and the second non-silicide region is positioned closed to the PMOS transistor.

5. The time-delay buffer of claim 3, wherein the first non-silicide region comprises a silicide block.

6. The time-delay buffer of claim 4, wherein the second non-silicide region comprises a silicide block.

7. The time-delay buffer of claim 1, wherein the silicide layer is further disposed on a source/drain of the PMOS and a source drain of the NMOS.

8. The time-delay buffer of claim 1, wherein the PMOS transistor is coupled to a first voltage, and the NMOS transistor is coupled to a second voltage, wherein the first voltage is higher than the second voltage.

9. The time-delay buffer of claim 8, wherein the capacitor is coupled to the second voltage.

10. A time-delay buffer, comprising:
    a CMOS inverter, comprising:
      a PMOS transistor;
      an NMOS transistor;
      a transistor gate common to the PMOS transistor and the NMOS transistor;
      a silicide layer disposed on a portion of the transistor gate; and
      a first non-silicide region disposed on a portion of the transistor gate; and a capacitor coupled to the PMOS transistor and the NMOS transistor.

11. The time-delay buffer of claim 10, wherein the first non-silicide region is positioned closed to the NMOS transistor.

12. The time-delay buffer of claim 11, wherein the CMOS inverter further comprises a second non-silicide region disposed on the transistor gate, and the second non-silicide region is positioned closed to the PMOS transistor.

13. The time-delay buffer of claim 11, wherein the first non-silicide region comprises a silicide block.

14. The time-delay buffer of claim 12, wherein the second non-silicide region comprises a silicide block.

15. The time-delay buffer of claim 10, wherein the silicide layer is further disposed on a source/drain of the PMOS and a source drain of the NMOS.

16. The time-delay buffer of claim 10, wherein the PMOS transistor is coupled to a first voltage, and the NMOS transistor is coupled to a second voltage, wherein the first voltage is higher than the second voltage.

17. The time-delay buffer of claim 16, wherein the capacitor is coupled to the second voltage.

18. A time-delay buffer, comprising:
 a CMOS inverter, comprising:
  a PMOS transistor;
  an NMOS transistor;
  a transistor gate common to the PMOS transistor and the NMOS transistor; and
  a silicide layer disposed a source/drain of the PMOS and a source drain of the NMOS, wherein no silicide layer is disposed on the transistor gate; and
 a capacitor coupled to the PMOS transistor and the NMOS transistor.

19. The time-delay buffer of claim 18, wherein the PMOS transistor is coupled to a first voltage, and the NMOS transistor is coupled to a second voltage, wherein the first voltage is higher than the second voltage.

20. The time-delay buffer of claim 19, wherein the capacitor is coupled to the second voltage.

* * * * *